United States Patent [19]

Kokaku et al.

[11] Patent Number: 5,225,499

[45] Date of Patent: Jul. 6, 1993

[54] RESIN COMPOSITION FOR ENCAPSULATING OF SEMICONDUCTOR AND SEMICONDUCTOR APPARATUS USING OF THE SAME

[75] Inventors: Hiroyoshi Kokaku; Masatsugu Ogata; Masanori Segawa; Hiroshi Hozoji; Akio Nishikawa; Fumio Sato, all of Hitachi, Japan

[73] Assignee: Hitachi, Ltd., Tokyo, Japan

[21] Appl. No.: 662,942

[22] Filed: Mar. 1, 1991

[30] Foreign Application Priority Data

Mar. 9, 1990 [JP] Japan .................. 2-59705

[51] Int. Cl.$^5$ ........................... C08F 283/00
[52] U.S. Cl. ..................... 525/530; 525/508; 257/788
[58] Field of Search ............ 357/72; 525/488, 530, 525/508; 257/788

[56] References Cited

U.S. PATENT DOCUMENTS

| | | | |
|---|---|---|---|
| 3,568,012 | 3/1971 | Ernst et al. | 357/72 |
| 4,617,584 | 10/1986 | Ikeya et al. | 357/72 |
| 4,618,878 | 10/1986 | Aoyama et al. | 357/72 |
| 4,900,807 | 2/1990 | Nishikawa et al. | 528/362 |
| 4,933,744 | 6/1990 | Segawa et al. | 357/72 |
| 4,951,122 | 8/1990 | Tsubosaki et al. | 357/72 |
| 5,082,880 | 1/1992 | Kitahara et al. | 523/466 |
| 5,134,204 | 7/1992 | Toriakai et al. | 525/481 |

FOREIGN PATENT DOCUMENTS 1404584 2/1987 Japan .
1-126321 5/1989 Japan .

*Primary Examiner*—Frank Gonzalez
*Attorney, Agent, or Firm*—Antonelli, Terry, Stout & Kraus

[57] ABSTRACT

A resin composition having superior molding character, bonding character, moisture resistance, and heat resistance, for encapsulating of a semiconductor which contains:

(a) An ether imide group compound represented by the general formula (I)

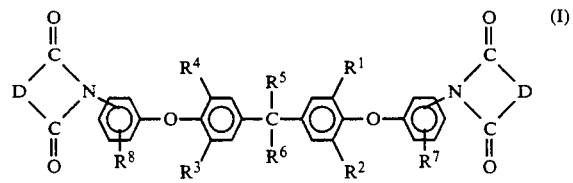

wherein, each of $R^1$-$R^4$, $R^8$ and $R^8$ is hydrogen, lower alkyl group, lower alkoxy group, lower fluoroalkyl group, chlorine or bromine, and $R^1$-$R^4$, $R^7$ and $R^8$ may be same or different each other, and each of $R^5$ and $R^6$ is hydrogen, methyl group, ethyl group, trifluoromethyl group or trichloromethyl group, and $R^5$ and $R^6$ may be same or different each other, and D is a hydrocarbon group of a dicarboxylic acid having an ethylene type unsaturated double bond of an extract of the compound obtained by extraction with water in an amount 10 times by weight of the compound at 120° C. for more than 100 hours has electric conductivity of at most 300 s/cm ph of 1.5-7; and (b) an epoxy resin as well as a semiconductor apparatus encapsulated with the resin.

7 Claims, 1 Drawing Sheet

RESIN COMPOSITION FOR ENCAPSULATING OF SEMICONDUCTOR AND SEMICONDUCTOR APPARATUS USING OF THE SAME

BACKGROUND OF THE INVENTION

The present invention relates to a resin composition for encapsulating of a semiconductor comprising a polyether imide compound of high purity, and to a semiconductor apparatus which is coated or encapsulated with the resin composition.

As structural materials for insulation, bonding, and packaging etc. of electronic apparatus and electrical machinery and apparatus,, resins such as the following are used depending on objects to be obtained:

thermosetting resins such as phenolic resin, unsaturated polyester resin, epoxy resin, silicone resin, and polyimide resin etc., and thermoplastic resins such as nylon, polyacetal, polycarbonate, polyester, polysulfone, polyethersulfone, polyamidoimide, fluorine resin etc.

However, with respect to a resin encapsulating type semiconductor apparatus or a laminated plate of printed circuit, for example, almost all resins which have been used are epoxy resin, silicone resin, and polyimide resin.

Especially, at least 80% of semiconductor products such as transistor, IC, LSI, VLSI, etc. are resin encapsulated types which are transfer fabricated using thermosetting resin, mainly epoxy resin.

A semiconductor chip of semiconductor products is improved every year in integration, and consequently, enlarging of the chip size, thinning of wiring, and multiplication of layers are advanced.

Accordingly, the surface of the semiconductor chip is becoming finer and the thickness of a resin layer of the semiconductor package is gradually becoming thinner.

Also, it has been found that accompanying transfer of the package from pin insertion type to surface package type, the package is exposed to higher temperature (at least 200° C.) at packaging. Therefore, thermal stress caused by difference of thermal expansion coefficients of the resin layer, the semiconductor chip, and a frame etc., which comprise the semiconductor apparatus, is becoming larger, and generation of cracks in encapsulating resin, the semiconductor as well as a passivation film, and short circuiting, cutting and misregistration etc. on the surface of the semiconductor chip easily occur and cause problems.

Under the circumstances described above, polyimide resin has attracted attention as a resin having superior heat resistance and small thermal expansion coefficient, and various kinds of imide resins have been proposed (Japan Pat. No. 1404584, JP-A-1-126321 (1989)). Nevertheless, the imide group resin composition of such prior art do not exhibit sufficient release from a molding die during a molding operation, and the mold release is a crucial problem for practical use of the resin.

One of the objects of the present invention is to provide a resin composition for encapsulating of the semiconductor devices having good molding character, bonding character, electrical characteristics, moisture resistance, and heat resistance etc., and also having superior mold release characteristics to provide a semiconductor apparatus encapsulated with the resin composition.

SUMMARY OF THE INVENTION

The inventors of the present invention investigated molding character, mold release, and hardening character of resin composition comprising polyimide group compound, and achieved the present invention. The gist of the present invention comprises a resin composition for encapsulating a semiconductor comprising:

(a) an ether imide group compound represented by the general formula (I)

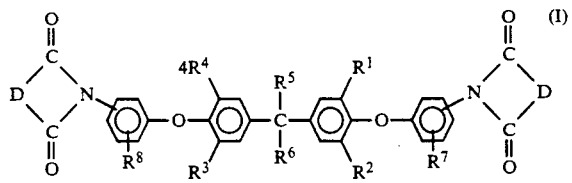

Wherein each of $R^1$-$R^4$, $R^7$ and $R^8$ is selected from the group consisting of hydrogen, lower alkyl group, lower alkoxy group, lower fluoroalkyl group, chlorine and bromine, and $R^1$-$R^4$, $R^7$ and $R^8$ may be the same or different from each other, each of $R^5$ and $R^6$ is selected from the group consisting of hydrogen, methyl group, ethyl group, and trichloromethyl group, and $R^5$ and $R^6$ may be same or different from each other and D is a hydrocarbon group of dicarboxylic acid having an ethylene type unsaturated double bond;

an extract of the compounds obtained by extraction with 10 times by weight of water at 120° C. for more than 100 hours has electric conductivity of at most 300 μs/cm and a pH of 1.5-7, and (b) an epoxy resin, and a semiconductor apparatus using the resin composition.

The ether imide group compounds represented by the general formula [I] are, for example, as follows: 2,2-bis[4-(4-maleimidophenoxy)phenyl]propane, 2,2-bis[3-methyl-4-(4-maleimidophenoxy)phenyl]propane, 2,2-bis[3-bromo-4-(4-maleimidophenoxy)phenyl]propane, 2,2-bis[3-ethyl-4-(4-maleimidophenoxy)phenyl]propane, 2,2-bis[3-propyl-4-(4-maleimidophenoxy)phenyl]propane, 2,2-bis[3-isoproply-4-(4-maleimidophenoxy)phenyl]propane, 2,2-bis [3-butyl-4-(4-maleimidophenoxy)phenyl]propane, 2,2-bis[3-sec-butyl-4-(4-maleimidophenoxy)phenyl]propane, 2,2-bis [3-methoxy-4-(4-maleimidophenoxy)phenyl]propane, 1,1-bis[4-(4-maleimidophenoxy)phenyl]ethane, 1,1-bis[3-methyl-4-(4-maleimidophenoxy)phenyl]ethane, 1,1-bis[3-chloro-4-(4-maleimidophenoxy)phenyl]ethane, 1,1-bis[3-bromo-4-(4-maleimidophenoxy)phenyl]ethane, bis[4-(4-maleimidophenoxy)phenyl]methane, bis[3-methyl-4-(4-maleimidophenoxy)phenyl] maleimidophenoxy)-phenyl]methane, bis[3-bromo-4-(4-maleimidophenoxy)-phenyl]methane, 1,1,1,3,3,3-hexachloro-2,2-bis[4-(4-maleimidophenoxy)phenyl]propane, 3,3-bis[4-(4-maleimidophenoxy)phenyl]pentane, 1,1-bis[4-(4-maleimidophenoxy)phenyl]propane, 1,1,1,3,3,3-hexafluoro-2,2-bis[3,5-dibromo-4-(4-maleimidophenoxy)-phenyl]propane, 1,1,1,3,3,3-hexafluoro-2,2-bis[3-methyl-4-(4-maleimidophenoxy)phenyl]propane, etc.

The ether imide group compound represented by the general formula (I), such as 2,2-bis[4-(4-maleimidophenoxy) phenyl]propane for example, is obtained by a reaction of 2,2-bis[4-(4-aminophenoxy)phenyl]propane and maleic anhydride. But, the preferred resin of the present invention which has superior mold release from a die is not obtained only by reaction.

To obtain the ether imide group compound having superior mold release, purity of the reaction product is important. An example of extreme purification is, as explained later in the embodiment, repeating of a purification process comprising steps of dissolving the reaction product with solvent such as acetone etc., precipitation by adding of hexane, and separation.

Necessary purity is such that, when the synthesized ether imide compound is extracted with water in an amount that is 10 times by weight of the compound at 120° C. for at least 100 hours, the extract has to have electrical conductivity of at most 300 μs/cm and a pH of 1.5-7.

Next, the epoxy resins described above are, for example, the following which have at least two epoxy groups in a molecule: bifunctional epoxy compounds such as diglycidyl ether of bisphenol A, butadiene diepoxide, 3,4-epoxycyclohexane carboxylate, vinylcyclohexane dioxide, 4,4'-di(1,2-epoxyethyl) diphenylether, 4,4'-di(1,2-epoxyethyl)dipheny, 2,2-bis(3,4-epoxycyclohexyl)propane, diglycidyl ether of resorcin, diglycidyl ether of fluoroglycine, diglycidyl ether of methylfluoroglycine, bis(2,3-epoxycyclopentyl)ether, 2-(3,4-epoxy)cyclohexane-5,5-spiro(3,4-epoxy)-cyclohexane-m-dioxane, bis(3,4-epoxy-6-methylcyclohexyl)adipate, N,N'-m-phenylene bis(4,5-epoxy-1,2-cyclohexane) dicarboxyimide etc., epoxy compounds having at least trifunctional groups such as triglycidyl ether of para-aminophenol, polyallylglycidyl ether, 1,3,5-tri(1,2-epoxyethyl)benzene, 2,2', 4,4'-tetraglycidoxybenzophenone, polyglycidyl ether of phenol-formaldehyde novolak, triglycidyl ether of glycerin, triglycidyl ether of trimethylolpropane etc.

In the present invention, mixing ratio of the ether imide group compound and the epoxy resin is preferably 20 -80% by weight for the former.

The addition of phenolic resin series to improve the hardening character in addition to mold release of the composition. As for the phenolic resin, even though both of resol type and novolak type are usable, resol type phenolic resin is preferable.

The resol type phenolic resin can be synthesized by a condensation reaction of a phenol group such as a phenol, cresol, and bisphenol A etc. with an aldehyde in the presence of amine, alkaline catalyst, and salt of organic metals. For instance, the resol type phenolic resin having the chemical structure represented by the general formula [II] or [III] is preferable

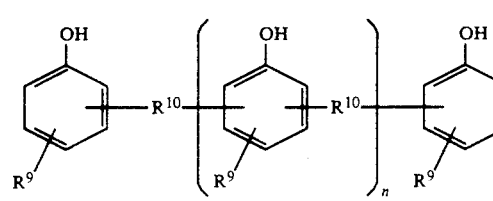

(II)

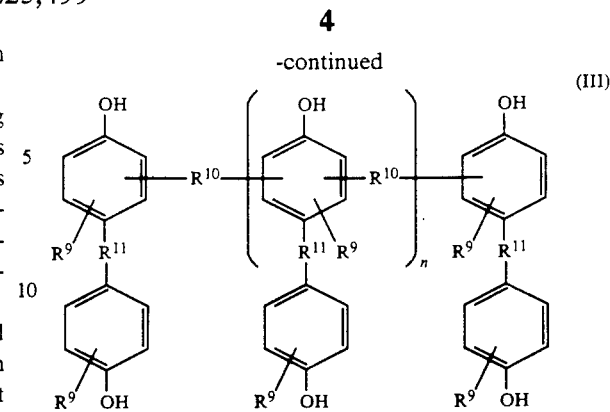

wherein $R^9$ represents H or —CH$_2$OH, $R^{10}$ represents —CH$_2$— or —CH$_2$—O—CH$_2$—, $R^{11}$ represents —CH$_2$, —C(CH$_3$)$_2$—, or —SO$_2$—, each $R^9$, $R^{10}$ and $R^{11}$ may be the same or different from each other and n represents an integer of at least 1.

Further, molecular weight of 400-3000 in number averaged molecular weight is preferable in view of hardening property and mobility of the resin.

A novolak type phenolic resin is obtainable by a reaction of a phenol such as phenol, cresol, and xylenol etc. with formaldehyde in the presence of acidic catalyst such as para-toluensesulfonic acid, hydrochloric acid, perchloric acid, and oxalic acid etc. The novolak type phenolic resin has essentially a chemical structure represented by the general formula [IV].

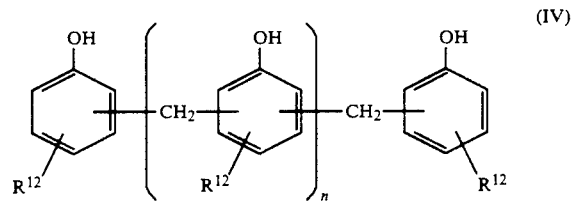

wherein, $R^{12}$ is —H, —CH3, and n represents an integer of at least 1.

Further, molecular weight of 400-3000 in number averaged molecular weight is preferable in view of hardening property and mobility of the resin.

After the reaction, the phenolic resin having high purity and no unreacted raw material and ionic impurities is preferable. Highly pure phenolic resin can be obtained by repeat of a washing process comprising the steps of dissolving the obtained condensate once in organic solvent, adding a large quantity of water, stirring strongly, subsequent stationary standing, and discarding top clear liquid by decantation.

Preferable standard of the purity is such as that the extract, which is extracted from the resin with water of 10 times by weight at 120 ° C. for at least 100 hours, has electric conductivity of at most 100 μs/cm and pH of 1.5-7, and content of each of halogen ion, ammonium ion or metallic ion is especially preferable at most 10 ppm respectively.

The phenolic resin is preferably mixed at most 20% by weight.

For hardening of the resin composition of the present invention by heating for a short time, addition of hardening catalyst is preferable.

As for the hardening catalyst, organic peroxide compounds such as following are effective; para-chlorobenzoyl peroxide, methyl ethyl ketone peroxide, cyclohexanone peroxide, bis(1-hydroxycyclohexyl peroxide), hydroxyheptyl peroxide, cumene hydroperoxide, dicumyl peroxide, 2,5-dimethyl-2,5-di(t-butylperoxide), 1,1-bis (t-butyl peroxide)-3,3-trimethylcyclohexanone, t-butyl perbenzoate, etc.

Further, hardening catalysts and hardening accelerators such as following are able to be used; hardening catalysts of imidazole group such as 2-phenyl-4-benzyl-5-hydroxymethylimidazole, 2-phenyl-4,5-dihydroxymethylimidazole, and 2-methylimidazole etc., hardening catalysts of phosphine group such as triphenylphosphine, diphenylphosphine etc., hardening accelerators such as 1,8-diazabicyclo(5,4,0)undecene, tetraphenylphosphonium, tetraphenylborate etc.

Various additives such as agents to give flexibility for increasing of toughness and lowering of modulus of elasticity, coupling agents, dyes and pigments, mold releasing agents to improve mold release from a die, etc. can be used concurrently within a range not to adversely affect the object of the present invention.

And further, inorganic fillers can be added. The inorganic filler is added aiming to improve thermal expansion coefficient, thermal conductivity, and modulus of elasticity etc. of the hardened body, and is preferably added within a range of 55–80% by volume to the total volume of the composition. The characteristics described above are not improved by addition of less than 55% by volume, and addition of beyond 80% by volume increases viscosity of the resin composition, therefore, mixing ratio is preferably determined depending on object and usage.

There are various suitable inorganic fillers, but as for electronic parts, it is important especially to use fillers having good thermal and chemical stability. Concretely, fused silica, crystalline silica, and alumina etc. are preferable. Spherical fused silica which has come to be produced in industrial mass production is effective because the silica has a small thermal expansion coefficient in itself, and when mixed with a resin, increment of viscosity and lowering of fluidity of the composition is small.

Average particle size of the filler is preferable in a range of 1–30 μm. If the particle size is smaller than 1 μm, viscosity of the resin composition is increased and the fluidity is lowered remarkably. On the other hand, the filler having the average particle size of larger than 30 μm is not preferable because it has such problems that the resin and the filler are easily separable at molding and heterogeneous layers are formed in the hardened body, and consequently, characteristics of the hardened body becomes unstable, and moreover, a property to be filled into a narrow gap is spoiled.

The reason why the mold release character of the resin composition of the present invention is improved is not clear, but, the reason is considered that the improvement is depending on the elimination of impurities such as unreacted material at the synthetic reaction of the ether imide group compound, etc.

Figure 1:
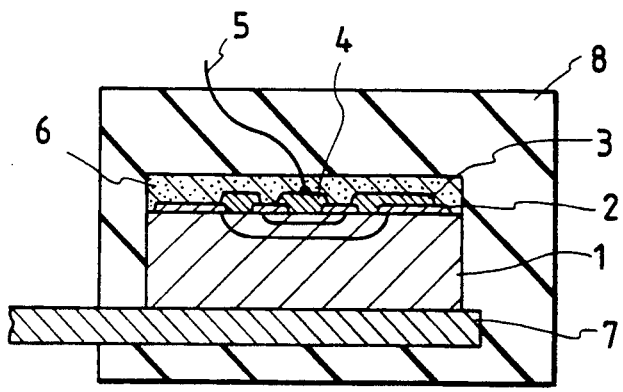
FIG. 1 is a schematic sectional view to illustrate a structure of a planer type transistor related to the present invention.

In the drawings the reference numerals for the various elements are as follows:

1, 11, 71 ... semiconductor device having a substrate of silicon, 2 ... silicone dioxide film, 3 ... base electrode, 4 ... emitter electrode, 5, 13, 74 ... wire, 6, 9 ... undercoat, 7 ... tab lead, 8 ... resin, 12 ... external connecting lead terminal, 4, 77 ... bonding pad, 15 ... ceramic package.

DESCRIPTION OF THE PREFERRED EMBODIMENTS

An embodiment of applying the resin composition of the present invention to an electronic apparatus is explained specifically referring to the drawings.

FIG. 1 is a schematic sectional view to illustrate a structure of a planer type transistor related to the present invention.

Transister of pnp type was formed in the surface layer of a semiconductor substrate 1 of silicon. For insulation between an emitter, a base, and a collecter, all of which were formed on surface of the substrate 1, a film of silicone dioxide 2 was formed. Further, a base electrode 3 and an emitter electrode 4 was formed as aluminum vapour deposition film. An element, of which substrate was fixed at an end of a tab lead 7 and bonded with gold (or aluminum) wire 5, and coated for protection with resin for undercoat 6, including an end portion of the tab lead 7 was transfer molded with resin 8 of the present invention.

Figure 2:
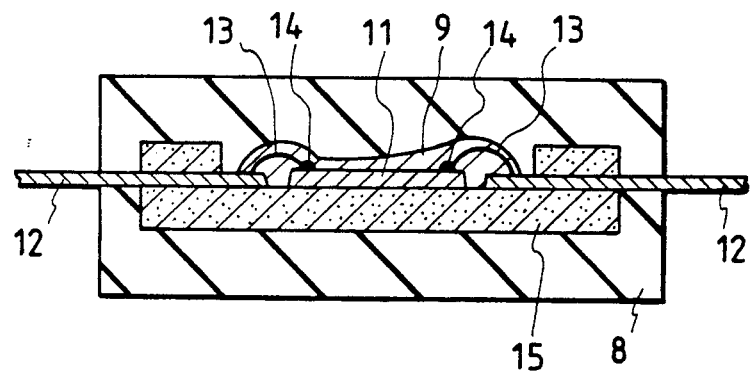
FIG. 2 is a schematic sectional view to illustrate a structure of a semiconductor apparatus having an integrated circuit.

FIG. 2 is a schematic sectional view to illustrate a structure of a semiconductor apparatus having an integrated circuit.

A semiconductor integrated circuit 11 was fixed on a package 15 comprising ceramic material, and a bonding pad 14 which was located at periphery of the integrated circuit 11 was connected to an external connecting lead terminal 12 with a bonding wire 13. All of the integrated circuit 11, the bonding wire 13, the external connecting lead terminal 12, and the bonding pad 14 were undercoated with moisture resistant polyimide 9 first and subsequently encapsulated further with the resin 8 of the present invention.

Figure 3:
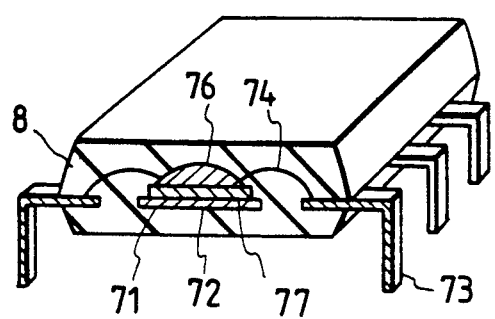
FIG. 3 is a perspective sectional view to illustrate a structure of a semiconductor memory element.

FIG. 3 is a perspective sectional view to illustrate a structure of a semiconductor memory element.

A memory element 71 comprising a silicon chip was fixed on a chip supporter 72, and an external lead 73 and an electrode pad 77 of the memory element 71 were connected with a bonding wire 74. An α ray shield layer 76 which was composed of a resin composition having at most 1 ppb of uranium and thorium content was formed on surface of the memory element. The memory element described above was transfer molded with the resin of the present invention.

As all of the semiconductor apparatus using the resin composition of the present invention have the preferable mold releasing property, the fraction found defective in the manufacturing process can be decreased remarkably, and the apparatus also have preferable heat resistance and moisture resistance.

Embodiment

The present invention is explained specificially with reference to the following embodiments.

Synthesis of ether imide compounds

After dissolving 200 g. of 2,2-bis[4-(4-aminophenoxy)phenyl]propane in 2 liters of acetone, 100 g. of maleic anhydride was added to the solution, and stirred at 2-5 °C. for 2 hours. Subsequently, 100 g. of acetic anhydride and 0.5 g. of potassium acetate were added to the solution and a reaction was caused with stirring for 2 hours.

After the reaction was completed, the reaction product was precipitated by adding of water, filtered, washed three times with water, and dried. And unrefined ether imide group compound was obtained.

One hundred grams of the unrefined ether imide group compound was dissolved in 100 ml. of acetone, and subsequently 1 liter of hexane was added to the solution to precipitate the ether imide group compound, then, the precipitate was separated from the solvent by filtration. The precipitate was dissolved again in 100 ml of acetone and reprecipitated by adding of 1 liter of hexane.

The procedure described above was repeated 2 times and 5 times respectively, and two kinds of ether imide compounds which have different purities (refined grade) were obtained.

The purity of the obtained ether imide group compounds were analysed with a high speed liquid chromatography. The content of the ether imide group compounds in the unrefined reaction product was 88%, and 93% in the 2 times refined product and 97% in the 5 times refined product.

Embodiment 1-3 and Comparative 1,2

Molding raw material was prepared by kneading of compositions having mixing ratio shown in table 1 with a biaxial roll of which surface temperature was 80° C.

Next, spiral flow, hardening by heating, and mold release were evaluated to examine the moldability of the molding raw material using a transfer molder with die temperature at 180° C., mold pressure by 70 kg/cm$^2$, and molding time for 90 seconds.

Epoxy equivalent 225 (made by Chiba Co.) for novolak type epoxy resin, phenol equivalent 106 g/eq (softening temperature 85° C.; made by Nihon Kayaku Co.) for novolak type phenol, and fused silica of average particle size of 6 m (made by Ryumori Co.) were used, respectivly.

The spiral flow test was performed by the method similar to EMMI-1-66, and defined the result as the standard of fluidity. The hardening by heating test was performed by measuring hardness of the molded body, which was molded into a disc shaped sample having 50 mm of diameter and 2 mm of thickness, soon after taken from the die with Bacol hardness tester (No. 935).

Mold release, which is one of the objects of the present invention, was tested by molding a disc having 50 mm of diameter and 2 mm of thickness with the composition on a metal plate of 2 mm thick which was made from the same material as the die and had the same surface condition as the die, and subsequent measuring and comparing the shear bonding strength.

The results are shown in table 1.

As shown in the table 1, the composition using the purified ether imide group compound is superior remarkably in mold release from the die.

Embodiment 4-8

Compositions shown in table 2 were prepared.

Epicoat 1001, epoxy equivalent 475 (made by Shell Co.) for bisphenol A type epoxy resin, and dimethylene ether type resol resin having softening temperature of 73° C. and number average molecular weight of 710 for resol type phenolic resin were used.

The kneading condition and the molding condition were the same as the embodiment 1. Further, glass transition temperature and linear expansion coefficient were measured with a thermophysics tester TMA-1500 (made by Shinkuu Riko Co.), and bending strength was measured on a sample having span length of 80 mm with an autograph DSS-500 (made by Shimazu Seisakusho Co.).

Volume resistivity was measured with a material characteristics automatic measurement system type TP-2100 (made by Ando Electric Co.). The results are shown in Table 2.

Comparative example 3-5

Purified (reprecipitation twice) ether imide group compounds were used in the comparative example 3 and 4, and unpurified example was used in the comparative example 5, and the characteristics of the molded bodies were measured with the same method as the embodiment 2. The results are shown in Table 2, comparatively.

Further, resin-encapsulated type semiconductor devices for testing having dimension of 6 mm×8 mm square were transfer molded using the compositions of the embodiments and the comparative examples, and reliability of the semiconductor devices described above such as heat resistance, moisture resistance, and reflow resistance were evaluated. The results are shown in Table 3.

The semiconductor device described above comprised a silicon chip having aluminum wiring in zigzag shape on the surface, a lead frame made of copper group metal on which the silicon chip was mounted, golden wire (30 μm in diameter) which connected the aluminum electrode on surface of the chip and the lead frame, and the resin composition which encapsulated the semiconductor device.

The semiconductor using the resin composition of the present invention has superior reliability in moisture resistance, heat resistance, and crack resistance of the package when mounting (reflowing), as shown in Table 3.

Embodiment 9-13

An evaluation test was performed on the semiconductor devices for testing which were encapsulated with the composition shown in table 4. In the composition, ether imide group compounds which had been treated five times repeatedly by the same purification process as described above. The results are shown in table 5 and 6.

TABLE 1

| | | Embodiment | | | Comparative example | |
|---|---|---|---|---|---|---|
| | | 1 | 2 | 3 | 1 | 2 |
| Composition | 2,2-bis[4-(4-maleimidophenoxy)phenyl] | — | — | — | 70 | — |

TABLE 1-continued

|  |  | Embodiment | | | Comparative example | |
|---|---|---|---|---|---|---|
|  |  | 1 | 2 | 3 | 1 | 2 |
| (parts by weight) | propan, unpurified |  |  |  |  |  |
|  | Same compound as above, purified (twice) | — | — | — | — | 70 |
|  | Same compound as above, purified (3 times) | 40 | 50 | 70 | — | — |
|  | o-Cresol novolak type epoxy resin | 60 | 34 | 20 | 20 | 20 |
|  | Novolak type phenol resin | — | — | 10 | 10 | 10 |
|  | Unsaturated polyester resin | — | 16 | — | — | — |
|  | Dicumyl peroxide | — | 1.0 | 0.2 | 0.2 | 0.2 |
|  | Triphenyl phosphine | — | — | 3 | 3 | 3 |
|  | Fused silica | 300 | 300 | 300 | 300 | 300 |
|  | Coupling agent (aminosilane) | 2 | 2 | 2 | 2 | 2 |
|  | Montanic acid ester | 1 | 1 | 1 | 1 | 1 |
| Moldability | Mold release (bonding force to an iron plate simulated the molding die: kg/cm$^2$) | 2 | 0 | 0 | 45 | 13 |
|  | Fluidity (spiral flow: inch) | 32 | 24 | 24 | 24 | 22 |
|  | Hardenability (hardness at high temperature: Bacol hardness) | 80 | 85 | 85 | 85 | 85 |

TABLE 2

|  | Items | Embodiment | | | | | Comparative example | | |
|---|---|---|---|---|---|---|---|---|---|
|  |  | 4 | 5 | 6 | 7 | 8 | 3 | 4 | 5 |
| Composition (parts by weight) | 2,2-bis[4-(4-maleimidophenoxy) phenyl propane | 40 | 70 | 50 | 20 | 50 | 70 | 70 | 70 |
|  | N,N'-ethylene dimaleimide | 40 | — | — | — | — | — | 20 | — |
|  | Bisphenol A type epoxy resin | 13 | 20 | 37 | 56 | 33 | 30 | 10 | 20 |
|  | Resol type phenol resin | 7 | 10 | 13 | — | — | — | — | 10 |
|  | Novolak type phenol resin | — | — | — | 24 | 17 | — | — | — |
|  | Dicumyl peroxide | 0.8 | 0.6 | 0.5 | 0.2 | 0.5 | 0.6 | 0.6 | 0.6 |
|  | 2-methyl imidazole | 0.4 | 0.5 | 0.3 | — | 0.3 | — | 0.3 | 0.5 |
|  | Triphenyl phosphine | — | — | 0.3 | 0.6 | 0.3 | 0.5 | 0.3 | — |
|  | Fused silica | 360 | 360 | 360 | 360 | 360 | 360 | 360 | 360 |
|  | Coupling agent (amino silane) | 2 | 2 | 2 | 2 | 2 | 2 | 2 | 2 |
|  | Montanic acid ester | 1 | 1 | 1 | 1 | 1 | 1 | 1 | 1 |
| Moldability | Mold release (kg/cm$^2$) | 2 | 0 | 0 | 0 | 0 | 15 | 22 | 20 |
|  | Spiral Flow (inch) | 15 | 24 | 22 | 26 | 25 | 23 | 20 | 22 |
|  | Hardenability (Bacol hardness after 180° C./120 seconds) | 80 | 85 | 85 | 85 | 85 | 80 | 85 | 85 |
| Characteristics of hardened body | Glass-transition temperature (°C.) | 165 | 180 | 178 | 175 | 179 | 178 | 182 | 178 |
|  | Linear expansion coefficient ($\times 10^{-5}$/°C.) | 1.6 | 1.6 | 1.6 | 1.5 | 1.6 | 1.6 | 1.6 | 1.6 |
|  | Bending strength ($\times 10^{-5}$/°C.) Room temperature | 13.5 | 13.0 | 12.4 | 11.5 | 13.0 | 12.5 | 13.0 | 13.1 |
|  | 215° C. |  |  |  |  |  |  |  |  |
|  | Volume resistance (Ω cm) Room temperature | >10$^{16}$ | >10$^{16}$ | >10$^{16}$ | >10$^{16}$ | >10$^{16}$ | >10$^{16}$ | >10$^{16}$ | 1.2 × 10$^{15}$ |
|  | 140° C. | 1.2 × 10$^{15}$ | 1.9 × 10$^{15}$ | 1.3 × 10$^{15}$ | 1.0 × 10$^{15}$ | 1.5 × 10$^{15}$ | 1.2 × 10$^{15}$ | 1.2 × 10$^{15}$ | 1.5 × 10$^{14}$ |
|  | Adhesive property (kg/cm$^2$) |  | 1.4 | 1.5 | 1.6 | 2.0 | 1.5 | 1.5 | 1.5 | 1.6 |

*Withdrawing strength of 42 alloy (0.25 mm thick and 5 mm wide) from sealing (sealing depth 10 mm)

TABLE 3

| Evaluation items | Testing hours | Embodiment | | | | | Comparative example | |
|---|---|---|---|---|---|---|---|---|
|  |  | 4 | 5 | 6 | 7 | 8 | 3 | 4 |
| 1. Reliability of moisture resistance (Corrosion of aluminum wiring when the resin sealed semiconductor device was exposed to steam of 121° C./2 atm after moistened in a condition of 65° C./95% RH/12 h and heated at 215° C. for 90 seconds.) | 100 h | 0/10 | 0/10 | 0/10 | 0/10 | 0/10 | 0/10 | 0/10 |
|  | 300 h | 0/10 | 0/10 | 0/10 | 0/10 | 0/10 | 0/10 | 0/10 |
|  | 500 h | 0/10 | 0/10 | 0/10 | 0/10 | 0/10 | 2/10 | 0/10 |
|  | 1000 h | 1/10 | 0/10 | 1/10 | 2/10 | 0/10 | 8/8 | 5/10 |
|  | 2000 h | 2/9 | 2/10 | 9/9 | 3/8 | 3/10 | — | 5/5 |
| 2. Reliability of heat resistance (Failure of connection at the connecting spot of Al electrode and Au wire when the resin sealed semiconductor device was exposed to atmosphere at 215° C.) | 50 h | 0/10 | 0/10 | 0/10 | 0/10 | 0/10 | 0/10 | 0/10 |
|  | 100 h | 0/10 | 0/10 | 0/10 | 0/10 | 0/10 | 0/10 | 0/10 |
|  | 200 h | 0/10 | 0/10 | 0/10 | 1/10 | 0/10 | 3/10 | 1/10 |
|  | 300 h | 0/10 | 2/10 | 0/10 | 2/9 | 2/10 | 5/7 | 4/9 |
| 3. Reflow resistance (Crack generation when the resin sealed semiconductor was heated in a vapour reflow furnace at 215° C. after exposed to a condition of 65° C./95% RH for designated testing hours) | 12 h | 0/10 | 0/10 | 0/10 | 0/10 | 0/10 | 0/10 | 0/10 |
|  | 24 h | 0/10 | 0/10 | 0/10 | 0/10 | 0/10 | 0/10 | 0/10 |
|  | 48 h | 0/10 | 0/10 | 0/10 | 0/10 | 0/10 | 2/10 | 3/10 |
|  | 72 h | 0/10 | 0/10 | 0/10 | 2/10 | 0/10 | 8/8 | 5/7 |
|  | 168 h | 0/10 | 0/10 | 1/10 | 2/8 | 0/10 | — | 2/2 |

Note:
0/10: number of failed samples/number of total samples

TABLE 4

| | | Embodiment | | | | |
|---|---|---|---|---|---|---|
| | | 9 | 10 | 11 | 12 | 13 |
| Composition (parts by weight) | 2,2-bis[4-(3-maleimidophenoxy)phenyl] propane | 50 | — | — | — | — |
| | 2,2-bis[4-(3-maleimidophenoxy)phenyl] hexafluoropropane | — | 50 | — | — | — |
| | 2,2-bis[4-(4-endomethylenetetrahydrophthalimidophenoxy)phenyl] propane | — | — | 50 | — | — |
| | 2,2-bis[4-(3-endomethylenetetrahydrophthalimidophenoxy)phenyl] hexafluoropropane | — | — | — | 50 | — |
| | 1,1,1,3,3,3-hexafluoro-2,2-bis[4-(4-endomethylenetetraphthalimido 3-trifluoromethanephenoxy)phenyl] propan | — | — | — | — | 50 |
| | Bisphenol A type epoxy resin | 37 | 37 | 37 | 37 | 37 |
| | Resol type phenol resin | 13 | 13 | 13 | 13 | 13 |
| | Dicumyl peroxide | 0.5 | 0.5 | 0.5 | 0.5 | 0.5 |
| | 2-methyl imidazole | 0.3 | 0.3 | 0.3 | 0.3 | 0.3 |
| | Triphenyl phosphine | 0.3 | 0.3 | 0.3 | 0.3 | 0.3 |
| | Fused silica | 360 | 360 | 360 | 360 | 360 |
| | Coupling agent (aminosilane) | 2 | 2 | 2 | 2 | 2 |
| | Montanic acid ester | 1 | 1 | 1 | 1 | 1 |

TABLE 5

| | | Embodiment | | | | |
|---|---|---|---|---|---|---|
| | | 9 | 10 | 11 | 12 | 13 |
| Mold release | | 1 | 0 | 1 | 0 | 1 |
| Spiral flow (inch) | | 22 | 21 | 25 | 21 | 26 |
| Hardness at high temperature (180° C./after 120 seconds) | | 75 | 75 | 75 | 70 | 75 |
| Glass transition temperature (°C.) | | 175 | 177 | 178 | 175 | 175 |
| Linear expansion coefficient ($\times 10^{-5}$°C.) | | 1.7 | 1.7 | 1.7 | 1.7 | 1.7 |
| Bending strength (kg/cm$^2$) | Room temperature | 12.6 | 12.2 | 13.0 | 12.5 | 13.2 |
| | 215° C. | 3.0 | 3.3 | 2.9 | 2.8 | 3.3 |
| Volume resistance ($\Omega$ cm) | Room temperature | >$10^{16}$ | >$10^{16}$ | >$10^{16}$ | >$10^{16}$ | >$10^{16}$ |
| | 140° C. | $1.1 \times 10^{15}$ | $2.0 \times 10^{15}$ | $1.0 \times 10^{15}$ | $2.5 \times 10^{15}$ | $3.0 \times 10^{15}$ |
| Adhesive property (kg/cm$^2$) | | 1.6 | 1.4 | 1.6 | 1.4 | 1.4 |

TABLE 6

| Evaluation items | Testing hours | Embodiment | | | | |
|---|---|---|---|---|---|---|
| | | 9 | 10 | 11 | 12 | 13 |
| 1. Reliability of moisture resistance (Corrosion of aluminum wiring when the resin sealed semiconductor device was exposed to steam of 121° C./2 atm after moistened in a condition of 65° C./95% RH/12 h and heated at 215° C. for 90 seconds.) | 100 h | 0/10 | 0/10 | 0/10 | 0/10 | 0/10 |
| | 300 h | 0/10 | 0/10 | 0/10 | 0/10 | 0/10 |
| | 500 h | 0/10 | 0/10 | 0/10 | 0/10 | 0/10 |
| | 1000 h | 1/10 | 0/10 | 1/10 | 0/10 | 0/10 |
| | 2000 h | 3/10 | 2/10 | 2/10 | 3/10 | 1/10 |
| 2. Reliability of heat resistance (Failure of connection at the connecting spot of Al electorde and Au wire when the resin sealed semiconductor device was exposed to atmosphere at 215° C.) | 50 h | 0/10 | 0/10 | 0/10 | 0/10 | 0/10 |
| | 200 h | 0/10 | 0/10 | 0/10 | 0/10 | 0/10 |
| | 300 h | 1/10 | 2/10 | 2/10 | 0/10 | 0/10 |
| 3. Reflow resistance (Crack generation when the resin sealed semiconductor was heated in a vapour reflow furnace at 215° C. after exposed to a condition of 65° C./95% RH for designated testing hours) | 12 h | 0/10 | 0/10 | 0/10 | 0/10 | 0/10 |
| | 24 h | 0/10 | 0/10 | 0/10 | 0/10 | 0/10 |
| | 48 h | 0/10 | 0/10 | 0/10 | 0/10 | 0/10 |
| | 72 h | 0/10 | 0/10 | 0/10 | 2/10 | 0/10 |
| | 168 h | 0/10 | 1/10 | 1/10 | 2/10 | 0/10 |

Note:
0/10: number of failed samples/number of total samples

What is claimed is:

1. A resin composition for encapsulating a semiconductor comprising:
   (a) an ether imide group-containing compound represented by the general formula (I):

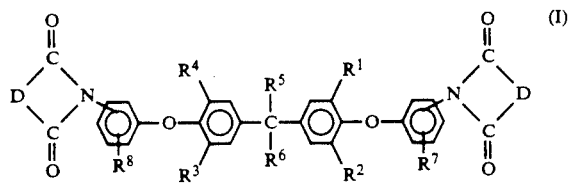

wherein each of $R^1$-$R^4$, $R^7$ and $R^8$ is selected from the group consisting of hydrogen, lower alkyl group, lower alkoxy group, lower fluoroalkyl group, chlorine and bromine, and $R^1$-$R^4$, $R^7$ and $R^8$ may be the same or different from each other, each of the $R^5$ and $R^6$ is selected from the group consisting of hydrogen, methyl group, ethyl group, trifluoromethyl group and trichloromethyl group, and $R^5$ and $R^6$ may be the same or different from each other; and D is a hydrocarbon group of a dicarboxylic acid having an ethylene type unsaturated double bond, an extract of said compound obtained by extraction with water in an amount 10 times by weight of the compound at a 120° C. for more than 100 hours having electrical conductivity of at most 300 μs/cm and a pH of 1.5-7, and
   (b) an epoxy resin.

2. A resin composition for encapsulating a semiconductor comprising:
   (a) an ether imide group-containing compound represented by the general formula (I):

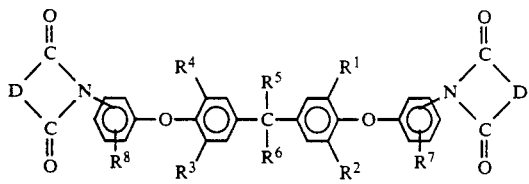
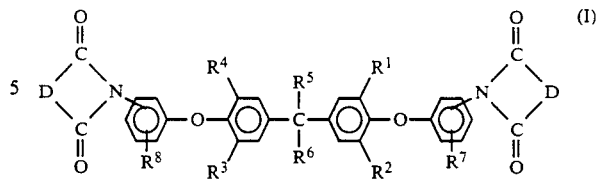

wherein each of $R^1$-$R^4$, $R^7$ and $R^8$ is selected from the group consisting of hydrogen, lower alkyl group, lower alkoxy group, lower fluoroalkyl group, chlorine and bromine, and $R^1$-$R^4$, $R^7$ and $R^8$ may be the same or different from each other; each of $R^5$ and $R^6$ is selected from the group consisting of hydrogen, methyl group, ethyl group, trifluoromethyl group and trichloromethyl group, and $R^5$ and $R^6$ may be the same or different from each other; and D is a hydrocarbon group of a dicarboxylic acid having an ethylene type unsaturated double bond, an extract of said compound obtained by extraction with water in an amount 10 times by weight of the compound at a 120° C. for more than 100 hours having an electrical conductivity of at most 300 μs/cm and a pH of 1.5-7, (b) an epoxy resin, and (c) a phenolic resin.

3. A resin composition for encapsulating a semiconductor according to claim 2, wherein said phenolic resin has a structure represented by the general formula (II) or (III):

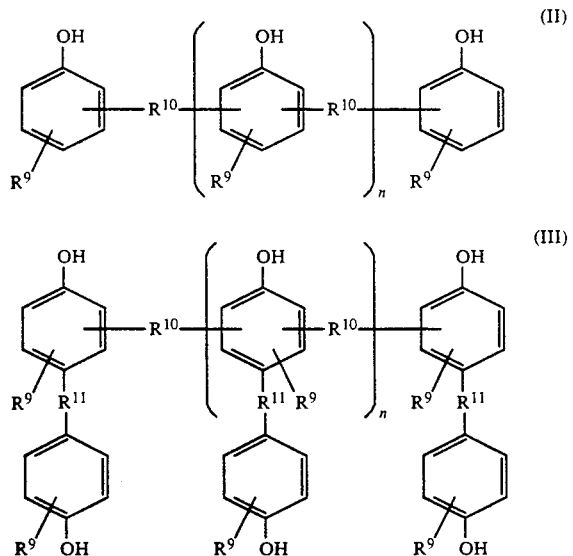

wherein $R^9$ represents H or —CH$_2$OH, $R^{10}$ represents —CH$_2$— or —CH$_2$—O—CH$_2$—, $R^{11}$ represents —CH$_2$, —C(CH$_3$)$_2$—, or —SO$_2$—, and each $R^9$, $R^{10}$ and $R^{11}$ may be the same or different from another and n represents an integer of at least 1.

4. A resin composition for encapsulating a semiconductor comprising:

(a) an ether imide group-containing compound represented by the general formula (I):

wherein each of $R^1$-$R^4$, $R^7$ and $R^8$ is selected from the group consisting of hydrogen, lower alkyl group, lower alkoxy group, lower fluoroalkyl group, chlorine and bromine, and $R^1$-$R^4$, $R^7$ and $R^8$ may be the same or different from each other, each of $R^5$ and $R^6$ is selected from the group consisting of hydrogen, methyl group, ethyl group, trifluoromethyl group and trichloromethyl group, and $R^5$ and $R^6$ may be the same or different from each other; and D is a hydrocarbon group of a dicarboxylic acid having an ethylene type unsaturated double bond, which has a purity of at least 95%, and (b) an epoxy resin.

5. A semiconductor apparatus having a semiconductor device at least a part of which is coated and/or encapsulated with a resin composition comprising:

(a) an ether imide group-containing compound represented by the general formula (I):

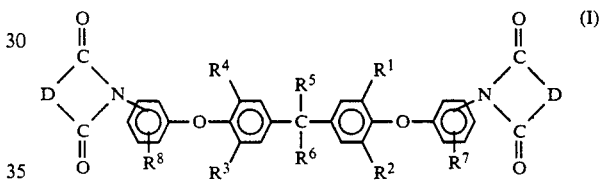

wherein each of $R^1$-$R^4$, $R^7$ and $R^8$ is selected from the group consisting of hydrogen, lower alkyl group, lower alkoxy group, lower fluoroalkyl group, chlorine and bromine, and $R^1$-$R^4$, $R^7$ and $R^8$ may be the same or different from each other, each of $R^5$ and $R^6$ is selected from the group consisting of hydrogen, methyl group, ethyl group, trifluoromethyl group and trichloromethyl group, and $R^5$ and $R^6$ may be the same or different from each other; and D is a hydrocarbon group of a dicarboxylic acid having an ethylene type unsaturated double bond, an extract of said compound obtained by extraction with water in an amount 10 times by weight of the compound at a 120° C. for more than 100 hours having electrical conductivity of at most 30 μs/cm and a pH of 1.5-7, and (b) an epoxy resin.

6. A semiconductor apparatus having a semiconductor device at least a part of which is coated and/or encapsulated with a resin composition comprising:

(a) an ether imide group-containing compound represented by the general formula (I):

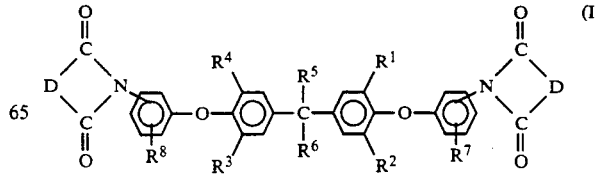

wherein each of $R^1$-$R^4$, $R^7$ and $R^8$ is selected from the group consisting of hydrogen, lower alkyl group, lower alkoxy group, lower fluoroalkyl group, chlorine and bromine, and $R^1$-$R^4$, $R^7$ and $R^8$ may be the same or different from each other; each of $R^5$ and $R^6$ is selected from the group consisting of hydrogen, methyl group, ethyl group, trifluoromethyl group and trichloromethyl group, and $R^5$ and $R^6$ may be the same or different from each other; and D is a hydrocarbon group of a dicarboxylic acid having an ethylene type unsaturated double bond, an extract of said compound obtained by extraction with water in an amount 10 times by weight of the compound at a 120° C. for more than 100 hours having an electrical conductivity of at most 300 μs/cm and a pH of 1.5–7, (b) an epoxy resin, and (c) a phenolic resin.

7. A semiconductor apparatus according to claim 6, wherein said phenolic resin has a structure represented by the general formula (II) or (III):

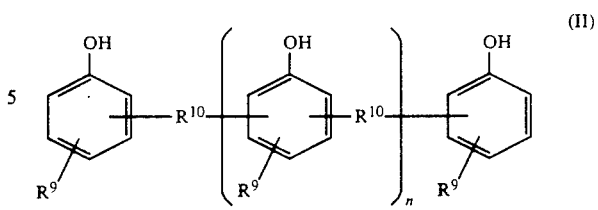

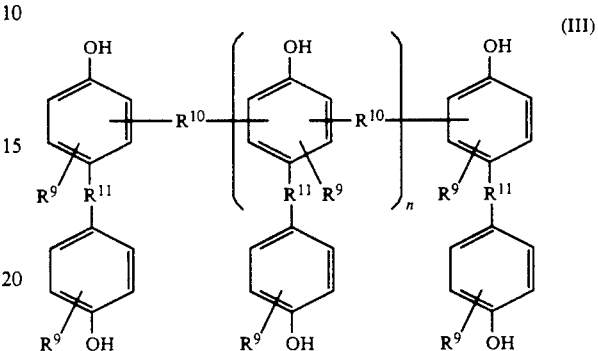

wherein $R^9$ represents H or —$CH_2OH$, $R^{10}$ represents —$CH_2$— or —$CH_2$—O—$CH_2$—, $R^{11}$ represents —$CH_2$, —$C(CH_3)_2$—, or —$SO_2$—, and each of $R^9$, $R^{10}$ and $R^{11}$ may be the same or different from the other and n represents an integer of at least 1.

* * * * *